United States Patent
Nakagawa et al.

(10) Patent No.: US 6,619,467 B1
(45) Date of Patent: Sep. 16, 2003

(54) COMPONENT FEEDER APPARATUS AND METHOD

(75) Inventors: Kiyoyuki Nakagawa, Takefu (JP); Kenichi Fukuda, Sabae (JP); Isamu Utsunomiya, Shiga-ken (JP)

(73) Assignee: Murata Manufacturing Co., Ltd., Nagaokakyo (JP)

( * ) Notice: Subject to any disclaimer, the term of this patent is extended or adjusted under 35 U.S.C. 154(b) by 326 days.

(21) Appl. No.: 09/287,135

(22) Filed: Apr. 7, 1999

(30) Foreign Application Priority Data

Apr. 7, 1998 (JP) .......................................... 10-094517

(51) Int. Cl.$^7$ ............................................. H05K 13/02
(52) U.S. Cl. .................... 198/396; 198/390; 221/236
(58) Field of Search .............................. 198/390, 396, 198/443; 221/236

(56) References Cited

U.S. PATENT DOCUMENTS

| | | | |
|---|---|---|---|
| 1,732,283 A | * 10/1929 | Schlaupitz | 198/396 |
| 4,459,743 A | * 7/1984 | Watanabe et al. | 29/740 |
| 4,460,108 A | * 7/1984 | Noda et al. | 221/236 X |
| 5,525,023 A | * 6/1996 | Soga et al. | 198/396 X |
| 5,636,725 A | * 6/1997 | Saito et al. | 198/396 |
| 6,032,783 A | * 3/2000 | Saito et al. | 198/390 |
| 6,062,423 A | * 5/2000 | Saito et al. | 221/236 |
| 6,073,800 A | * 6/2000 | Saito et al. | 221/236 X |

FOREIGN PATENT DOCUMENTS

| | | | |
|---|---|---|---|
| JP | 8-48419 A | * | 2/1996 |
| JP | 8-169554 A | * | 7/1996 |
| JP | 10-270895 A | * | 7/1996 |
| JP | 10-229294 A | * | 8/1998 |

\* cited by examiner

*Primary Examiner*—Eileen D. Lillis
*Assistant Examiner*—Thuy V. Tran
(74) *Attorney, Agent, or Firm*—Burns, Doane, Swecker & Mathis, LLP

(57) ABSTRACT

A feeder for feeding electronic chip components includes a hopper having a discharge opening at its bottom and having and an aligning path forming member for agitating electronic chip components. The aligning path forming member agitates the electronic chip components by its reciprocating movement within the discharge opening of the hopper. The reciprocating stroke of the aligning path forming member can be varied, and the stroke is controlled to be shorter when the number of electronic chip components remaining in the hopper is reduced. This allows the electronic chip components to be guided more reliably into an aligning path formed by the aligning path forming member, regardless of the number of electronic chip components remaining in the hopper.

19 Claims, 3 Drawing Sheets

COMPONENT FEEDER APPARATUS AND METHOD

This application corresponds to Japanese Patent Application No. 10-94517, filed on Apr. 7, 1998, which is hereby incorporated by reference in its entirety.

BACKGROUND OF THE INVENTION

1. Field of the Invention

The present invention relates to a feeder and feeding technique for feeding electronic chip components, and more particularly, to a feeder and feeding technique for feeding a plurality of randomly oriented electronic chip components in an aligned state.

2. Description of the Related Art

Feeders can be used for aligning and feeding a plurality of randomly oriented electronic chip components (such as capacitors, resistors, transistors, and filters). FIG. 4 schematically illustrates one related feeder for feeding electronic chip components. The feeder 1 shown there for feeding electronic chip components includes a retaining section 2, an aligning section 3, a conveying section 4, and a dispensing section 5, as respective functional sections.

The retaining section 2 includes a hopper 7 for retaining a plurality of electronic chip components 6 (illustrated in aggregate) in a randomly oriented state. A discharge opening 8 is formed in the bottom of the hopper 7. The aligning section 3 is associated with the discharge opening 8.

FIG. 5 is a cut-away perspective view showing the aligning section 3. As indicated there, an aligning path forming member 10 for forming a tubular aligning path 9 is disposed in the aligning section 3. The aligning path forming member 10 is placed inside the discharge opening 8, and reciprocates in the axial direction of the discharge opening 8 with a predetermined stroke 11 (or "stroke range"), as indicated by solid lines and dotted lines in FIG. 5. This allows the aligning path forming member 10 to agitate electronic chip components 6, which are to be discharged from the discharge opening 8. Only the electronic chip components 6 oriented in a predetermined direction by this agitation are received into the aligning path 9.

In the aligning section 3 shown in FIG. 5, a fixed pipe 12 for guiding the electronic chip components 6 in an aligned state can be further provided within the tubular aligning path 9 of the aligning path forming member 10. This fixed pipe 12 serves to enable very small electronic chip components 6 to be handled. The inner diameter of the fixed pipe 12 is selected so as to receive an electronic component 6 only when the longitudinal direction of the electronic chip component 6 agrees with the axial direction of the fixed pipe 12.

As described above, the aligning path forming member 10 agitates the electronic chip components 6, by reciprocating movement thereof so as to smoothly move the electronic chip components 6 in the hopper 7, and to guide them to the aligning path 9 or the fixed pipe 12. In order to more smoothly guide the electronic chip components 6 to the aligning path 9 or the fixed pipe 12, a conical concave surface is formed on an end surface 13 located within the hopper 7 of the aligning path forming member 10.

Referring again to FIG. 4, the electronic chip components 6 which have passed through the aligning path forming member 10 or, more specifically, through the fixed pipe 12, arrive at the conveying section 4. In the conveying section 4, a conveying path 14 provided by, for example, a conveyor belt (not shown), is formed. The conveying path 14 conveys the electronic chip components 6 passing through the fixed pipe 12 in an aligned state.

The dispensing section 5, is formed at the end of the conveying path 14. In the dispensing section 5, a dispensing mechanism (not shown) is disposed for dispensing the electronic chip components 6. A device, such as a vacuum chuck, for picking up the electronic chip components 6, can be used as the dispensing mechanism.

In the feeder 1 for electronic chip components as described above, the number of the electronic chip components 6 guided into the aligning path 9 or the fixed pipe 12 per unit of time is usually set to be larger than the number of the electronic chip components 6 dispensed in the dispensing section 5 per unit of time. Therefore, a number of electronic chip components 6 are retained in the conveying path 14 so that the electronic chip components 6, which are to be dispensed, are not depleted from the dispensing section 5.

As described above, since the aligning path forming member 10 agitates the electronic chip components 6 by reciprocating movement thereof so as to guide the components into the aligning path 9 or the fixed pipe 12, one to more electronic chip components 6 should ideally be guided into the fixed pipe 12 in each cycle of the reciprocating movement of the aligning path forming member 10 without any interruption.

However, while the aligning path forming member 10 performs its reciprocating movements, a phenomenon may occur, as observed by the present inventors, in which the electronic chip components 6 fail to be guided into the aligning path 9 or the fixed pipe 12. For example, when 50,000 electronic chip components 6, each having the dimensions of 1.0×0.5×0.5 mm, are placed into the hopper 7, and when the number of the electronic chip components 6 remaining in the hopper 7 decreases to less than 10,000, the electronic chip components 6 are often not smoothly guided into the aligning path 9 or the fixed pipe 12.

FIG. 6 illustrates this phenomenon. In FIG. 6, the vertical axis represents the guiding-capacity corresponding to the number of the electronic chip components 6 to be guided into the aligning path 9 per reciprocating cycle of the aligning path forming member 10, and the horizontal axis represents the number of electronic chip components 6 remaining in the hopper 7. It is observed that high guiding capacity is obtained when the remaining number of electronic chip components 6 is relatively large, such as "R1" or more, but the guiding capacity is reduced when the remaining number is less than "R1," and decreases to "R2" and "R3."

As discovered by the present inventors, the indicated curve may vary with the dimensions of each electronic chip component 6 and the length of the stroke 11. When each electronic chip component 6 has the dimensions of 1.0×0.5×0.5 mm and the stroke 11 is 12 mm, "R1" is 10,000, "R2" is 5,000, and "R3" is 3,000. When the remaining number of electronic components 6 decreases to about 3,000, the guiding capacity is significantly reduced.

One reason for the reduction in the guiding capacity may be as follows. That is, when a small number of electronic chip components 6 remain in the hopper 7, the electronic chip components 6 jump in the hopper 7 due to the reciprocating movement of the aligning path forming member 10 and the lack of a large number of other electronic chip components 6 to dampen their movements, preventing them from entering into the aligning path 9 or the fixed pipe 12. In addition, the existence of only a small number of electronic chip components 6 in the hopper 7, to the extent that they are tossed by the reciprocating movement of the aligning path forming member 10, means the probability of the electronic chip components 6 being near the discharge opening 8 is low, and hence, there is a reduced opportunity for the electronic chip components 6 to be guided into the aligning path 9 of the aligning path forming member 10 or the fixed pipe 12 due to the effects of gravity.

In order to prevent the reduction in the aforementioned guiding capacity, new electronic chip components 6 may be added to the hopper 7 so that the number of electronic chip components 6 remaining in the hopper is not reduced to less than 10,000, for example. In this case, however, the following problems are encountered.

The electronic chip components 6 of different lots may be mixed into one hopper 7. That is, some of the electronic chip components 6 remain in the hopper 7 before adding the new batch. Hence, a significant number of the electronic chip components 6 may become mechanically damaged, reducing the quality thereof, because they are impacted by the aligning path forming member 10 for a long period of time.

In order to avoid the above-mentioned problem, even if thousands of electronic chip components 6 remain in the hopper 7, the fresh electronic chip components 6 can be placed into the hopper 7 after removing the remaining ("old") electronic chip components 6 when the above-mentioned guiding capacity is reduced. In this case, however, thousands of electronic chip components 6 will be wasted, and a relatively long period of time is required to replace the electronic chip components 6 to be pooled in the hopper 7.

SUMMARY OF THE INVENTION

Accordingly, it is an object of the present invention to provide a feeder and feeding technique for feeding electronic chip components which can maintain the guiding capacity for feeding electronic chip components into an aligning path of an aligning path forming member at a level higher than a predetermined level, regardless of the number of electronic chip components remaining in the hopper.

In accordance with an aspect of the present invention, a feeder is provided for feeding electronic chip components, including a hopper for retaining a plurality of electronic chip components. The hopper has a discharge opening formed in the bottom thereof. The feeder also includes an aligning path forming member located within the discharge opening for agitating electronic chip components by its reciprocating movement in the axial direction of the discharge opening. The aligning path forming member also forms a tubular aligning path which receives therein only the electronic chip components aligned in a predetermined direction. A conveying path is provided for conveying the electronic chip components which have passed through the aligning path forming member in an aligned state, and a mechanism for dispensing electronic chip components is provided at the end portion of the conveying path. According to a particularly advantageous feature, the reciprocating stroke range of the aligning path forming member can be varied.

More specifically, the stroke range of the aligning path forming member may preferably be controlled to be shortened when the number of electronic chip components remaining in the hopper is reduced. The stroke range can be shortened one or more times, or on a continuous basis. The stroke range of the aligning path forming member may preferably be reduced at least once when the number of electronic chip components remaining in the hopper is reduced to about one-fifth or less of the capacity of the hopper.

The feeder may further include a fixed pipe for guiding electronic chip components in an aligned state, the fixed pipe being disposed within the tubular aligning path of the aligning path forming member. In addition, the feeder can employ a conical concave surface formed on an end face located within the hopper of the aligning path forming member.

BRIEF DESCRIPTION OF THE DRAWINGS

The foregoing, and other, objects, features and advantages of the present invention will be more readily understood upon reading the following detailed description in conjunction with the drawings in which.

DESCRIPTION OF THE PREFERRED EMBODIMENTS

Figure 1:
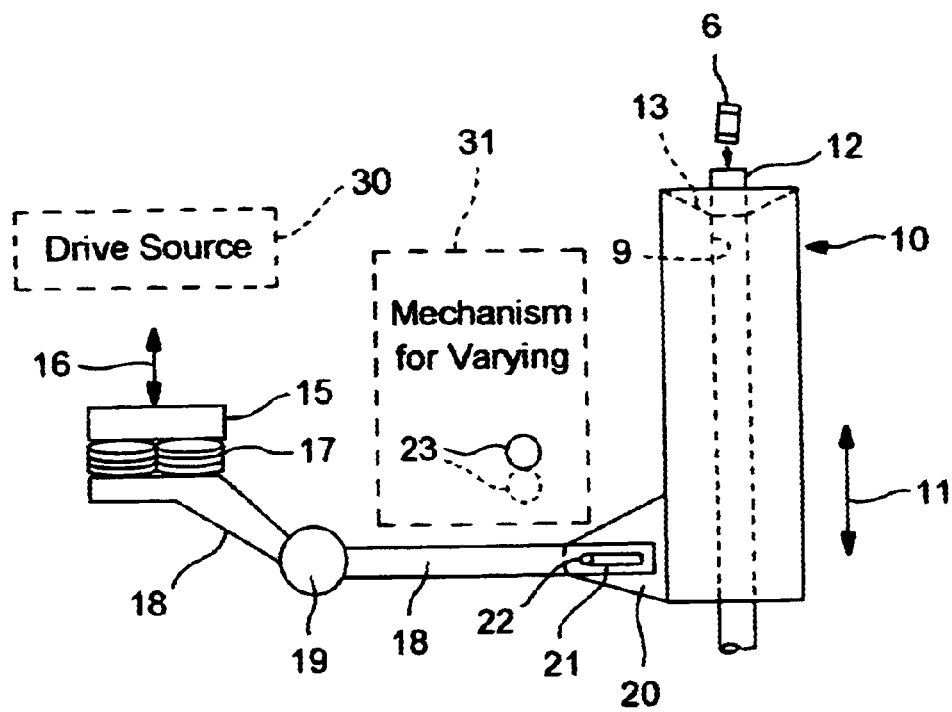
FIG. 1 is a front view showing an aligning path forming member 10 and components relating thereto included in a feeder for feeding electronic chip components in accordance with an embodiment of the present invention.
Figure 4:
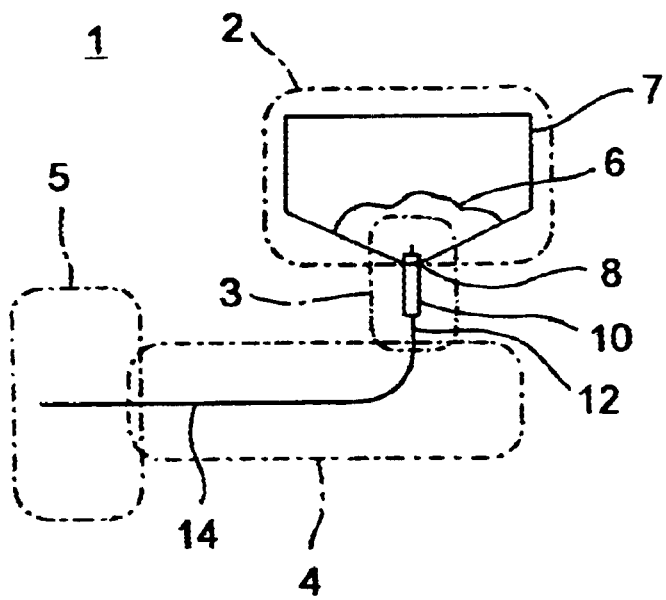
FIG. 4 is a schematic front view of a related feeder 1 for feeding electronic chip components.

FIG. 1 illustrates a feeder for feeding electronic chip components in accordance with an embodiment of the present invention. The feeder for feeding electronic chip components in this embodiment is basically configured to be substantially the same as the related feeder 1 for feeding electronic chip components described with reference to FIGS. 4 and 5, with the exceptions noted below. Therefore 9, like features are assigned like reference numbers, and a discussion of previously identified features will be omitted.

As described above, an aligning path forming member 10 is placed inside of a discharge opening 8 of a hopper 7 (see FIGS. 4 and 5), so as to agitate electronic chip components 6, which are to be discharged from the discharge opening 8, by reciprocating in the axial direction of the discharge opening 8. The aligning path forming member 10 also forms a tubular aligning path 9 which receives only the electronic chip components 6 aligned in a predetermined direction. In addition, a conical concave surface is formed on an end face 13 located within the hopper 7 of the aligning path forming member 10.

The reciprocating stroke 11 (also referred to as "stroke range") of the aligning path forming member 10 can be varied. More specifically, as shown in FIG. 1, an input member 15 is reciprocated by a suitable drive source 30 as shown by an arrow 16. The reciprocating movement of the input member 15 is transmitted to an end of a lever 18 via a buffer material 17. The lever 18 is supported in a pivotal state by a fulcrum 19, and is rocked (e.g., moved back and forth) by the reciprocating movement of the input member 15.

The other end of the lever 18 is connected to a bracket 20 mounted to the aligning path forming member 10. In order to accommodate the directional difference between the rocking motion of the lever 18 and the linear motion of the aligning path forming member 18 at the connected portion, a guide groove 21 is formed in an end of the lever 18. The lever is coupled to the bracket 20 via a pin 22 which can move in the guide groove 21. In this way, the rocking motion of the lever 18 is transmitted to the aligning path forming member 10, and the aligning path forming member 10 reciprocates with the stroke 11. In this embodiment, the pin 22 is fixed to the bracket 20 and the guide groove 21 is formed in the end of the lever 18, but pin 22 can be fixed to the lever 18 and the guide groove 21 can be formed in the bracket 20. In any event, the bracket 20 and pin 22 assembly provides some play in the coupling between the lever 18 and the aligning path forming member 10. Other coupling arrangements can be used to provide the same result, as will be apparent to those skilled in the art.

In addition, a stopper 23 is provided so as to abut against the lever 18. The stopper 23 is located in the path swept by the movement of the lever 18 so as to block the movement of the lever 18. That is, the lever 18 is brought into abutment with the stopper 23 to define a terminal end of the rocking motion. Advantageously, the position of the stopper 23 can be changed, as shown by the solid line and the dotted lines in FIG. 1, such as by the mechanism 31 for varying the stroke range. By changing the position of the stopper 23, a rocking range of the lever 18 is varied. This, in turn, varies the stroke 11 of the aligning path forming member.

In order to absorb the difference between the amount of reciprocating motion of the input member 15 within a fixed range and the amount of rocking motion of the lever 18 within a variable range, the aforementioned buffer material 17 is provided. That is, this buffer material 17 can be compressed by an amount which depends on the position of the stopper 23.

Figure 2:
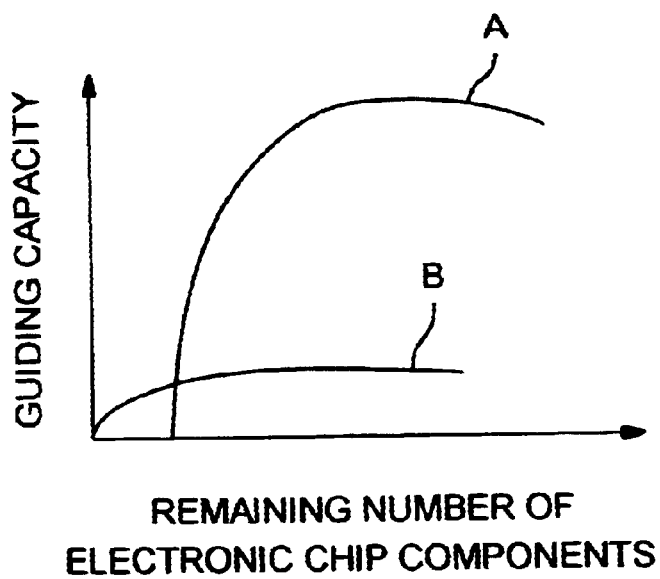
FIG. 2 is a graph showing the relationship between the remaining number of electronic chip components 6 and the guiding capacity for the electronic chip components 6 into the aligning path 9 when a stroke provided by the aligning path forming member 10 shown in FIG. 1 is set to a relatively long stroke A and a relatively short stroke B.

The present invention is based, in part, on the discovery that the guiding capacity for the electronic chip components 6 into the aligning path 9 of the aligning path forming member 10 can be maintained at a level higher than a predetermined level by varying the reciprocating stroke 11 of the aligning path forming member 10 in accordance with the number of electronic chip components 6 remaining in the hopper 7. That is, as shown in FIG. 2, the relationship between the number of electronic chip components 6 remaining in the hopper 7 and the guiding capacity for the electronic chip components 6 into the aligning path 9 of the aligning path forming member 10 differs with the stroke 11 of the aligning path forming member 10. In the case of a relatively long stroke 11, as indicated by curve A, the guiding capacity is high when the remaining number is large, but the guiding capacity is significantly reduced when the remaining number is small. In contrast, in the case of a relatively short stroke 11, as indicated by curve B, a guiding capacity higher than the predetermined level can be maintained even if the remaining number is reduced.

Therefore, in this embodiment, a relatively long stroke 11 for providing the guiding capacity indicated by the curve A is adopted when the remaining number of electronic chip components 6 is large. When the remaining number of electronic chip components 6 is reduced, the stopper 23 shown in FIG. 1 is displaced from the position shown by the solid line to the position shown by the dotted lines. More specifically, the stopper 23 is moved at the point in time in which the guiding capacity indicated by the curve B exceeds the guiding capacity indicated by the curve A. In this manner, the stroke 11 of the aligning path forming member 10 is shortened so as to obtain the guiding capacity indicated by the curve B. The stroke 11 can be manually or automatically adjusted. An indication of the number of electronic chip components 6 remaining in the hopper 7 can be obtained through various means, such as counter which counts the number of electronic chip components 6 which have been dispensed, a weighing mechanism which weighs the mass of electronic chip components 6 in the hopper 7, etc.

For example, assume that the guiding capacity indicated by the curve A is obtained when the stroke 11 is 12 mm and the guiding capacity indicated by the curve B is obtained when the stroke 11 is 7 mm. In this case, the guiding capacity indicated by the curve B exceeds the guiding capacity indicated by the curve A when the remaining number of electronic chip components 6 is reduced to below 8,000 (in one particular example). At this point, the stroke 11 is changed from 12 mm to 7 mm (e.g., at the point where the remaining number of electronic chip components 6 becomes 8,000).

Figure 3:
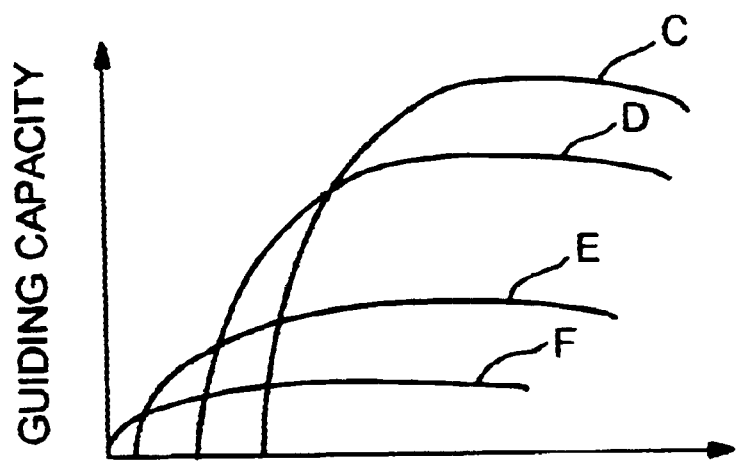
FIG. 3 is a graph similar to FIG. 2 for explaining a feeder for feeding electronic chip components in accordance with another embodiment of the present invention.

The stroke 11 may be varied at three or more levels, and the control for reducing the stroke 11 may be correspondingly performed two or more times. This will be described with reference to FIG. 3. In FIG. 3, the relationship between the remaining number of the electronic chip components 6 and the guiding capacity is shown with respect to four levels of strokes 11 providing the guiding capacity indicated by curves C, D, E, and F. The curve C represents a case of the longest stroke 11, the curve D represents a case of the second longest stroke 11, the curve E represents a case of the third longest stroke 11, and the curve F represents a case of the shortest stroke 11, respectively. Of course, more than four gradations of stroke 11 can be provided; the indicated four levels is exemplary.

As shown in FIG. 3, as the remaining number of electronic chip components 6 is reduced, the stroke 11 of the aligning path forming member 10 is sequentially shortened. That is, the stroke is first shortened at the point where the guiding capacity indicated by the curve D exceeds the guiding capacity indicated by the curve C, and then at the point where the guiding capacity indicated by the curve E exceeds the guiding capacity indicated by the curve D, and then at the point where the guiding capacity indicated by the curve F exceeds the guiding capacity indicated by the curve E. Therefore, in this embodiment, the stopper shown in FIG. 1 is formed so as to be successively located at positions for achieving the stroke 11 corresponding to the curves C, D, E and F, respectively.

By varying the stroke 11 of the aligning path forming member 10 at multiple levels, the stroke 11 can be more finely controlled in accordance with the remaining number of electronic chip components 6, thereby enabling the guiding capacity for electronic chip components 6 into the aligning path 9 to be maintained at a satisfactory level over a wider range for the remaining number of electronic chip components 6. In another embodiment, the stroke 11 of the aligning path forming member 10 may be varied continuously with the decrease in the remaining number of electronic chip components 6.

While the present invention has been described with reference to the embodiments shown in the drawings, various modifications may be made within the scope of the invention. For example, the number of the electronic chip components 6 remaining in the hopper 7 at which the stroke 11 of the aligning path forming member 10 is reduced, and the degree of reduction of the stroke 11 should be varied in accordance with the dimensions of the electronic chip components 6 and the feeding speed required therefor. According to an experiment, the stroke of the aligning path forming member is effectively altered at least once when the remaining number of the electronic chip components is reduced to approximately one-fifth or less, preferably approximately one-fifth to one-tenth of the capacity of the hopper.

In addition, in the above-mentioned embodiments, the stopper 23 that defines the rocking range of the lever 18 for reciprocating the aligning path forming member 10 is formed to be displaceable so that the stroke 11 of the aligning path forming member 10 can be varied. The stroke 11, however, may be varied by, for example, changing the reciprocating range of the input member 15. In this case, the buffer material 17 may optionally be omitted.

Figure 5:
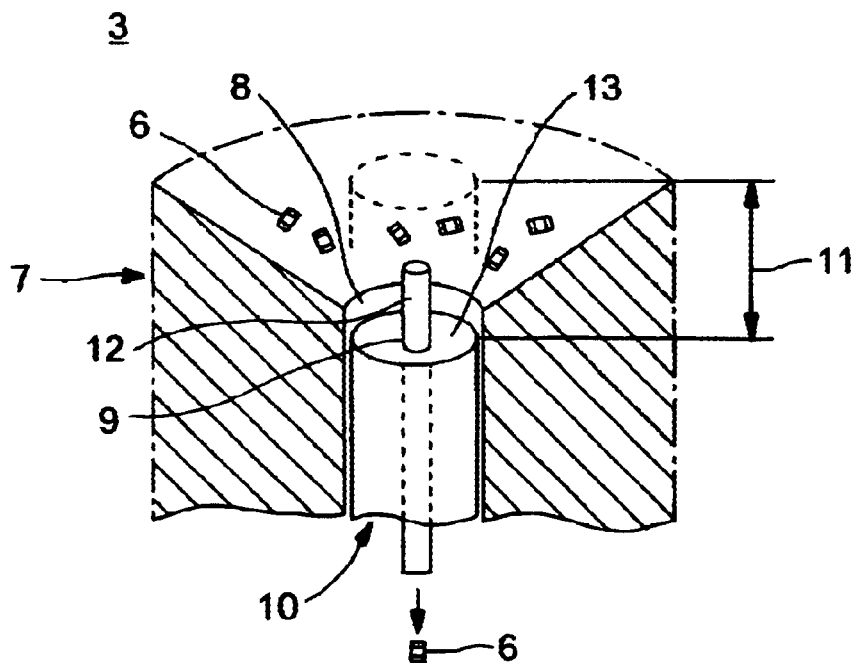
FIG. 5 is an enlarged view of an aligning section 3 shown in FIG. 3.
Figure 6:
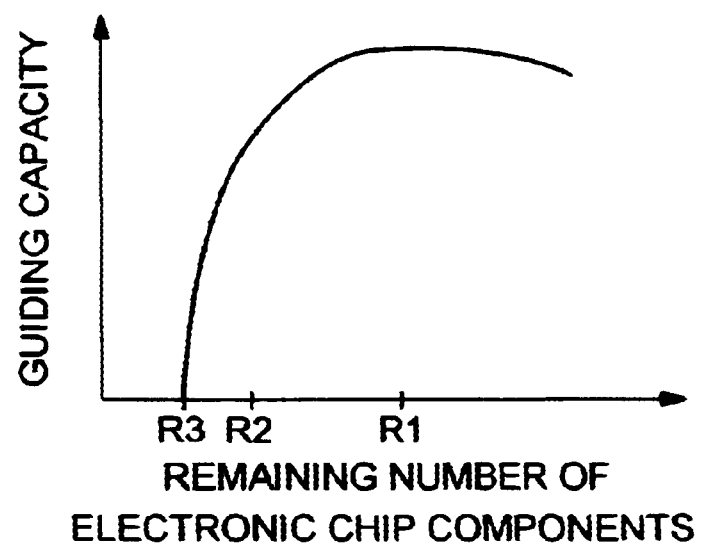
FIG. 6 is a graph similar to FIG. 2 for explaining the problems which the present invention addresses.

In addition, the aligning path forming member 10 in accordance with the above-mentioned embodiments includes the fixed pipe 12 shown in FIG. 5 that is located within the aligning path 9, and the electronic chip components 6 pass through the fixed pipe to be guided thereby in an aligned state. However, the fixed pipe 12 can be omitted, in which case the electronic chip components 6 pass directly through the aligning path 9 to be guided in the aligned state.

As described above, the reciprocating stroke of the aligning path forming member can be varied so that the guiding capacity for the electronic chip components into the aligning path can be maintained at a satisfactory level in accordance with the number of electronic chip components remaining in the hopper. Accordingly, the electronic chip components can be reliably guided into the aligning path, regardless of the number of electronic chip components remaining in the hopper. Accordingly, the probability that the feeding of the electronic chip components is undesirably interrupted can be reduced.

In addition, variation in the reciprocating stroke of the aligning path forming member can respond to variations in the dimensions of the electronic chip components and in the feeding speed required for the electronic chip components. Accordingly, variation in the stroke of the aligning path forming member can immediately respond to the variations in the type and the lot of the electronic chip components to be fed.

In accordance with the present invention, if the stroke of the aligning path forming member is controlled to be short when the number of electronic chip components remaining in the hopper is reduced, the guiding capacity for the electronic chip components into the aligning path does not unduly degrade. That is, the guiding capacity can be maintained at a level higher than a predetermined level. In addition, when the remaining number of the electronic chip components is relatively large, high-level guiding capacity can be achieved by increasing the stroke of the aligning path forming member.

As described above, it is experimentally shown that the guiding capacity for a large number of electronic chip components is significantly reduced when the aligning path forming member 10 is reciprocated with a relatively large stroke and the remaining number of the electronic chip components is reduced to below 10,000. In one particular example, in the present invention the stroke of the aligning path forming member is affected at least once after the number of electronic chip components is reduced to below 10,000. Hence, the guiding capacity can be maintained at a level higher than the predetermined level in most cases, regardless of the remaining number of electronic chip components.

In accordance with the present invention, a feeder for feeding electronic chip components suitable for feeding smaller sized components can be provided if the fixed pipe for guiding electronic chip components in an aligned state is further disposed in the aligning path of the aligning path forming member.

In addition, in accordance with the present invention, if the conical concave surface is formed on the end face located within the hopper of the aligning path forming member, the electronic chip components can be advantageously guided into the aligning path along the conical concave surface.

The above-described exemplary embodiments are intended to be illustrative in all respects, rather than restrictive, of the present invention. Thus the present invention is capable of many variations in detailed implementation that can be derived from the description contained herein by a person skilled in the art. All such variations and modifications are considered to be within the scope and spirit of the present invention as defined by the following claims.

What is claimed is:

1. A feeder for feeding electronic chip components, comprising:
    a hopper for retaining a plurality of electronic chip components, said hopper having a discharge opening formed in the bottom thereof;
    an aligning path forming member having a tubular aligning path for receiving the electronic chip components in an aligned state, said aligning path forming member located within said discharge opening;
    a mechanism for reciprocating said aligning path forming member in an axial direction of said discharge opening over a stroke range having an upper limit, wherein said upper limit is the upper projection height of said aligning path forming member, and wherein movement of said aligning path forming member agitates the electronic chip components, causing the electronic chip components to enter said tubular aligning path; and
    a mechanism for varying said upper limit of said stroke range of said aligning path forming member, such that said upper projection height of said aligning path forming member can be varied.

2. The feeder according to claim 1, further comprising:
    a conveying path for conveying electronic chip components which have passed through said aligning path forming member in an aligned state.

3. The feeder according to claim 2, further comprising:
    a dispenser for dispensing electronic chip components from an end portion of said conveying path.

4. The feeder according to claim 1, wherein said mechanism for varying said stroke range reduces said stroke range when the number of electronic chip components in said hopper decreases.

5. The feeder according to claim 4, wherein said mechanism for varying said stroke range selects a stroke range from among a predetermined number of stroke ranges.

6. The feeder according to claim 5, wherein the predetermined number of stroke ranges is 2.

7. The feeder according to claim 4, wherein said mechanism for varying said stroke range continuously adjusts said stroke range depending on the remaining number of electronic chip components in said hopper.

8. The feeder according to claim 4, wherein said stroke range is decreased at least once when a number of remaining electronic chip components in said hopper is reduced to one-fifth or less of the capacity of said hopper.

9. The feeder according to claim 1, further comprising a fixed pipe disposed within said tubular aligning path of said aligning path forming member for guiding the electronic chip components in the aligned state.

10. The feeder according to claim 1, wherein said aligning path forming member has a concave surface formed on its end face located within said hopper.

11. The feeder according to claim 1, wherein said mechanism for reciprocating said aligning path forming member in an axial direction includes:

a drive source; and a lever which couples said drive source to said aligning path forming member.

12. The feeder according to claim 11, wherein said lever is coupled to said aligning path forming member via a pin which is movable within a guide groove.

13. The feeder according to claim 11, wherein said lever pivots about a fulcrum point.

14. The feeder according to claim 11, wherein said drive source is coupled to said lever via a buffer material disposed between said drive source and said lever.

15. The feeder according to claim 11, wherein said mechanism for varying said stroke range includes a stopper which is positioned so that said stopper blocks the path of said lever, and thereby defines a terminal end of said stroke range.

16. A method for feeding electronic chip components, comprising the steps of:

receiving a plurality of electronic chip components in a hopper of a feeder;

agitating the electronic chip components with an aligning path forming member by moving the aligning path forming member over a stroke range, thereby causing the electronic components to enter a tubular aligning path formed by the aligning path forming member; and when the number of electronic chip components in said hopper decreases, shortening the stroke range of the aligning path forming member.

17. The method according to claim 16, wherein the step of shortening the stroke range of the aligning path forming member shortens the stroke range when the number of remaining electronic chip components decreases to a predetermined number.

18. The method according to claim 16, wherein the step of shortening the stroke range of the aligning path forming member shortens the stroke range continuously as the number of remaining electronic chip components decreases.

19. The method according to claim 16, wherein the step of shortening the stroke range of the aligning path forming member shortens the stroke range when the number of remaining electronic chip components decreases to about $1/5$ of the capacity of the hopper.

* * * * *